United States Patent

[11] 3,573,571

[72] Inventors Dale M. Brown
Niskayuna;
William E. Engeler, Scotia, N.Y.

[21] Appl. No. 725,825
[22] Filed May 1, 1968
[45] Patented Apr. 6, 1971
[73] Assignee General Electric Company
Continuation-in-part of application Ser. No. 675,226, Oct. 13, 1967, now abandoned.

[54] SURFACE-DIFFUSED TRANSISTOR WITH ISOLATED FIELD PLATE
10 Claims, 4 Drawing Figs.

[52] U.S. Cl. .......... 317/235, 317/234, 307/304, 148/186
[51] Int. Cl. .......... H01l 11/14
[50] Field of Search .......... 317/235, 235/21.1, 235/46, 235/46.1, 234/15.4, 234/15.3; 317/234/9

[56] References Cited
UNITED STATES PATENTS

| | | | |
|---|---|---|---|
| 3,373,323 | 3/1968 | Wolfrum | 317/235 |
| 3,446,995 | 5/1969 | Castrucci | 307/304 |
| 3,440,500 | 4/1969 | Coppen | 317/235 |
| 3,333,168 | 7/1967 | Hofstein | 317/235 |
| 3,436,623 | 4/1969 | Beer | 317/235 |
| 3,257,588 | 6/1966 | Mueller | 317/234 |

*Primary Examiner*—John W. Huckert
*Assistant Examiner*—Martin H. Edlow
*Attorneys*—Paul A. Frank, John F. Ahern, Frank L. Neuhauser, Oscar B. Waddell and Melvin M. Goldenberg

ABSTRACT: A surface-diffused transistor exhibiting high stability and low collector capacitance includes a metallic field plate buried within an insulating film which covers the active major wafer surface thereof and passivates a surface-adjacent collector junction. Metal field plate is fixed to a negative potential and prevents inversion of a surface-adjacent region of the P-type semiconductor, thereby preventing surface leakage and increased capacitance.

Inventors:
Dale M. Brown,
William E. Engeler,
by John F. Ahern
Their Attorney.

SURFACE-DIFFUSED TRANSISTOR WITH ISOLATED FIELD PLATE

The present invention is a continuation-in-part of our copending application, Ser. No. 657,226, filed Oct. 13, 1967, and is related to surface-diffused transistors in which the formation of opposite conductivity channels in one type conductivity regions is caused by the interaction of charges within a passivating insulating layer. More particularly, in PNP surface diffused transistors wherein a plurality of regions are successively diffused to form base and emitter regions, means are provided for preventing the formation of surface adjacent N-channels in P-type regions to eliminate leakage along the surface at the semiconductor-insulator interface. This application relates to the copending applications, Ser. No. 657,227–Brown and Garfinkel; Ser. No. 675,225–Engeler; Ser. No. 675,228–Brown, Engeler, Garfinkel and Gray; and Ser. No. 679,957–Brown and Engeler, all of which were filed Oct. 13, 1967, and assigned to the present assignee, the disclosures of which are incorporated herein by reference thereto.

In the present state of semiconductor technology, it is known that surface effects, which deleteriously affect the operation of transistor devices, are of great importance, often causing more failures than due bulk effects. In surface diffused PNP transistors, for example, a particular problem exists. Since the varying regions of the PNP transistor are adjacent to the same major surface thereof and are generally coated by an insulating passivation layer the function of which is to minimize surface effects, it has been found that the degradation of the surface of the collector region often occurs by a phenomenon variously identified as "surface depletion" of "-surface inversion," depending upon the degree of the effect. This phenomenon is believed to be due to positive ions, as for example, sodium impurity ions, which may be present within the oxide or other passivation layer which is utilized. Additionally, positive ions may be diffused into the passivation film when electrical connections to base and emitter electrodes thereof are formed over the surface of the insulating layer, as is the practice when PNP transistors are made a portion of integrated circuits.

In such a transistor, the collector junction is reverse biased, that is, a negative potential is applied to the collector with respect to the base. Any positive ions which may be present in the passivation layer, at the active surface of the transistor, are repelled by the base lead passing over the surface thereof, and tend to accumulate and drift toward the insulator-semiconductor interface, particularly at the collector region. Because of this accumulation of positive charge within the surface adjacent portion of the insulator, electrons are drawn to the surface-adjacent portion of the collector region and holes are depleted therefrom, resulting in a depletion or inversion layer which may form a negatively conducting channel over the surface thereof. This channel deleteriously affects transistor operation, in that it may cause leakage along the surface of the collector. Additionally, collector capacitance is increased and the input impedance of the transistor is adversely affected. Similar problems may cause the formation of P-channels at the interfaces of N-type semiconductors with insulation films.

Accordingly, it is an object of the present invention to provide an improved surface diffused transistor devices having improved leakage and capacitance characteristics.

Another object of the present invention is to provide surface diffused transistors in which the formation of spurious opposite conductivity channels is inhibited in one conductivity type semiconductor bodies at the interface of one conductivity regions with insulating-passivating films.

Still another object of the present invention is to provide PNP transistors having high stability and minimal surface effects.

Yet another object of the present invention is to provide PNP transistor devices in which the collector region thereof is shielded electrostatically to remove any inherent N-channel over the surface thereof and to prevent the formation of induced N-channels at the surface thereof at a later time.

Still another object of the present invention is to provide means for fabricating surface diffused transistors which eliminates the formation of an opposite conductivity type surface inversion layer at the interface of a one conductivity-type region with an insulation and passivation film.

Briefly stated, in accord with one embodiment of the present invention, we provide a PNP surface diffused transistor having collector, base, and emitter regions and surface passivation thereover, wherein the surface passivation layer contains a buried metallic plate which overlays the collector, particularly at the region immediately exterior to the base region, and is in self registry with the collector-base junction and which is effective, by the application of a fixed negative potential thereto, to prevent inversion of the electrical conductivity characteristics of the surface of the collector region, thus reducing collector capacity and surface leakage. Additionally, the fixed negative potential upon the buried field plate results in reduced feedback capacitance and gain-enhanced input capacitance.

In accord with another embodiment of the present invention, we provide for such a transistor having a self-registered, highly P-type guard ring diffused into the collector region and surrounding the base region. In another embodiment of the present invention, we provide such a transistor wherein the entire surface of the collector region possesses an enhanced P-type characteristic, additionally minimizing the tendency toward surface inversion.

The novel features believed characteristic of the present invention are set forth in the appended claims. The invention itself, together with further objects and advantages thereof, may best be understood with respect to the following detailed description taken in connection with the appended drawing in which:

Figures 1, 2:
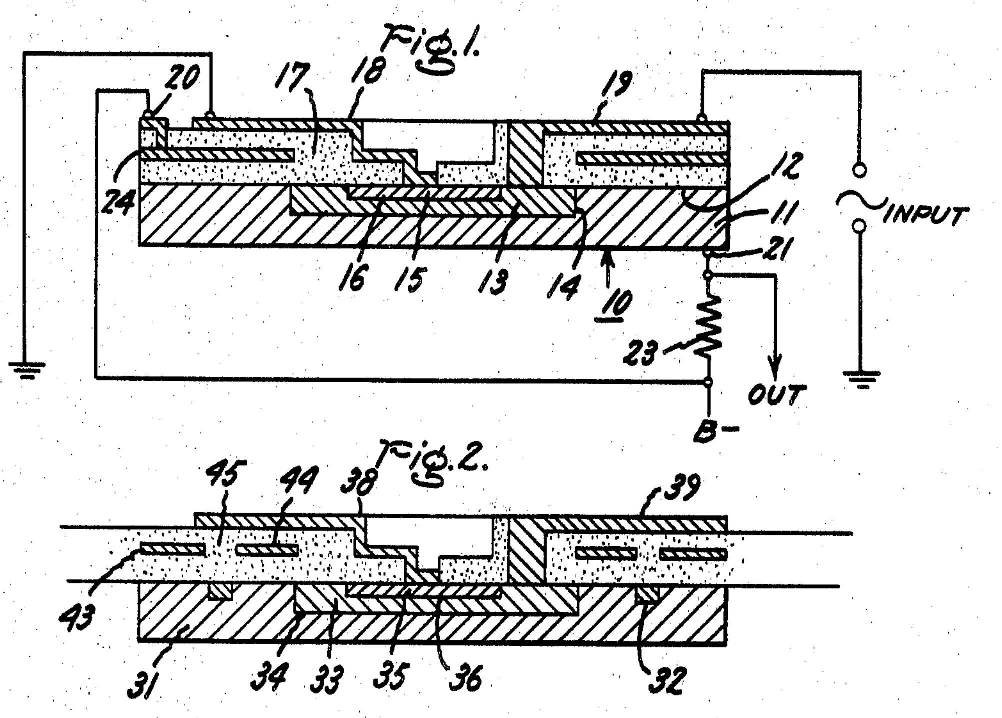
FIG. 1 is a schematic, vertical cross-sectional view of a PNP surface diffused transistor constructed in accord with the present invention.
FIG. 2 is a vertical cross-sectional view, in schematic, of an alternative embodiment of the invention adapted for use in an integrated circuit.

As described hereinbefore, an important reason for the limitations in surface diffused transistors, particularly PNP transistors, is the formation of a channel at the surface of the semiconductor immediately under a passivating insulating layer, due to depletion of that region of acceptor activators and the attraction thereto of negative conduction carriers. This phenomenon is generally present in P-type regions of surface diffused transistors and is particularly important in PNP transistors wherein the collector region is adversely affected. This adverse effect is evidenced as leakage over the collector surface, which increases the collector area and hence, the collector capacitance and, at high applied collector-base voltages, and tends to produce a space charge limited characteristic.

It has been proposed, in order to avoid the formation of surface-adjacent N-channels in collector region of PNP surface-diffused transistors, that a "guard ring" be formed in the collector region, concentric with the base region and spaced therefrom. This guard ring is a heavily-doped, low resistivity, P-type conductivity region which resists surface depletion and inversion and tends to limit the spreading effect of the channel to the area of the collector contained within the guard ring.

It has been reported in the semiconductor literature that, even the utilization of a guard ring, by itself, is insufficient to prevent the deleterious effect of surface inversion and that, at very high applied voltages, even the low resistant P-type guard ring can be surface-inverted. The proposed solution to this problem is that the guard ring be electrically connected with an electric conductor juxtaposed over the surface of the passivation film in the region of the collector. This would insure that the electric potential on either side of the passivating dielectric layer be the same, thus preventing ion drift from the exterior surface of the insulator to the semiconductor adjacent surface of the insulator. While some advantage may be gained from this expedient, the effect of ion depletion at the surface-adjacent portion of the collector of the PNP transistor is not completely eliminated and the collector is still at its own potential, as is the shielding conductor. Due to this, an active capacitance between the shielding conductor and base and base contact exists, and may adversely affect transistor input impedance. Additionally, this expedient does not provide means for eliminating any already-formed channel at the insulator-semiconductor interface. In accord with the present invention, we provide means for completely eliminating surface inversion by a positive repulsion of ions from the surface-adjacent portion of the passivating-insulating layer in surface diffused junction transistors and the depletion of majority carriers to the surface-adjacent depletion region of the semiconductor. By "anchoring" the negative field plate which accomplishes this end to a fixed potential, we are also able to eliminate the feedback capacity between collector region and base leads.

Devices of the present invention are generally these including one or more asymmetrically conductive junction. As used herein "asymmetrically conductive" refers to junctions between different conductivity regions, which may be of different conductivity type or of different orders of conductivity of the same type. Such junctions include P–N junctions, P–$P^+$ junctions, N–$N^+$ junctions, and PIN junctions, for example. The term "asymmetrically" refers to the asymmetry of the V–I characteristic in forward and reverse bias directions and does not have a geometrical connotation.

One device constructed in accord with the present invention is illustrated in FIG. 1. In FIG. 1, a PNP surface-diffused junction transistor is fabricated from a semiconductive wafer 10 having P-type conductivity region 11 and a major surface 12. A base region 13 having N-type conduction characteristics is formed by surface diffusion of a donor activator impurity into a surface-adjacent portion thereof. A collector P–N junction 14 is formed at the interface between P-type collector region 11 and N-type region 13. An emitter region 15 having P-type conduction characteristics is formed by the diffusion of an acceptor activator impurity into a portion of a surface-adjacent portion of base region 13. An emitter junction 16 is created at the interface between emitter region 15 and base region 13. An insulating-passivating layer 17, of a suitable insulator, covers surface 12 of wafer 10. Emitter contact 18 is plated over a portion of insulator 17 and is in electrical contact with emitter region 15. Base contact 19 is plated over another portion of the surface of insulator 17, and is in electrical contact with base region 13. Conveniently, the transistor of FIG. 1 may be fabricated from a wafer 10 of silicon having an epitaxially-grown P-type conductivity collector region 11 caused by the addition of approximately $10^{16}$ atoms per cubic centimeters thereof of boron, for example. Base region 13 may be formed by the diffusion of phosphorus, antimony, or arsenic therein a concentration of the order of $5\times10^{17}$ atoms of activator impurity per cubic centimeter thereof, for example. Emitter region 15 may, for example, be formed by the diffusion of a concentration of, for example, $10^{19}$ atoms of boron, for example, per cubic centimeter thereof into a portion of base region 13. Such diffusion to form PNP junction transistors, is well know to the art and may be conducted at conventional temperatures and under conventional conditions, also well known to the art.

Within insulator 17, a field plate 24 of a conductive material, preferably a refractory metal, as for example, molybdenum or tungsten, which is nonreactive with the passivating material, is buried therein and electrically isolated from all active regions of the transistor. Field plate 24 has an interior dimension substantially the same as the exterior dimension of base region 13, and has the same configuration as the exterior thereof. The formation of buried metallic field plates within insulating passivating dielectric materials is described in greater detail and claimed in the aforementioned copending application Ser. No. 675,225, filed Oct. 13, 1967, by W. E. Engeler the entire disclosure of which in incorporated herein by reference thereto.

Insulating-passivating dielectric layer 17 is actually the sum of several films which are formed sequentially, as is described in detail in the aforementioned application of W. E. Engeler. The insulator of layer 17 may conveniently comprise silicon dioxide, which has excellent passivation characteristics for silicon. As used herein a "passivation" layer is a high purity, continuous insulating layer at least 200 AU thick which effectively prevents the formation of surface states. Similarly, all or a portion of this layer may be composed of one or more films of silicon nitride or an amorphous mixture of silicon, oxygen, and nitrogen known as silicon oxynitride, which is disclosed and claimed in the copending application Ser. No. 598,305, filed Dec. 1, 1966 by F. G. Heumann, and assigned to the present assignee, the entire disclosure of which is incorporated herein by reference thereto. The passivation layer may be formed of one or more films as described above, in any order desired in order to achieve the desired results.

In general, the device as illustrated in FIG. 1 may, for example, be formed by utilizing a P-type silicon wafer having a boron concentration of approximately $10^{16}$ atoms of boron per cubic centimeter of silicon. This wafer is then placed in a reaction vessel and heated in a dry oxygen atmosphere for a time of approximately 2 hours at a temperature of, for example, 1000° C. to form a 1000 AU, for example, film of thermally-grown silicon dioxide. After formation of the silicon dioxide film, a 1000 AU film of molybdenum may be formed thereover by sputtering, from a triode glow discharge apparatus utilizing a quantity of molybdenum as one cathode thereof, onto the closely juxtaposed surface of the oxide coated silicon wafer. Conveniently, this may be accomplished in an atmosphere of 0.015 torr of argon in approximately 10 minutes.

After formation of the molybdenum conducting film, for example, a second film of an insulator, as for example, silicon dioxide, silicon nitride or silicon oxynitride is formed over the molybdenum conductive film. Assuming a silicon dioxide film is formed, this may be accomplished by the pyrolysis from an argon flow over the wafer. To accomplish this, pure, dry argon is bubbled through ethyl orthosilicate at a rate of 7 cubic feet per hour and passed over the wafer heated to 800° C, for example. To form a silicon dioxide film approximately 2000 AU thick, the flow is continued for approximately 15 minutes.

After the deposition of the second silicon dioxide film, a photoresist pattern having a central aperture corresponding to the desired size and configuration of the base region of the transistor is formed by photolithographic techniques, well known to the art. The second-formed oxide and molybdenum films are then etched away in the region of the central aperture leaving the passivation portion of layer 17, first formed, in place over the remainder of the silicon wafer surface 12. This may be accomplished by first immersing the wafer in Buffered HF etchant for approximately 2 minutes to etch the exposed portion of oxide film 17 down to the molybdenum film, washing in distilled water and immersing the wafer in a ferricyanide etch for approximately 15 seconds to remove the molybdenum film, and washing in distilled water.

The second deposited silicon dioxide film and the molybdenum field plate now serve as a diffusion mask for forming the base region 13, so that when the base is formed, the molybdenum field plate is in registry therewith and follows the pattern formed by the intersection of the base collector junction with the surface 12. Since the first-formed portion of the oxide layer is not removed in the region immediately above the collector junction, its initial high quality, electrical insulating properties are retained intact.

The sequence of film formation may be changed, as for example, by the addition of the formation of a silicon nitride film before or after the deposition of either silicon dioxide film and the inclusion of etching step of etching $Si_3N_4$ in concentrated HF, if necessary, or the deposition of a film of silicon oxynitride and etching therein in Buffered HF. It is important, however, to obtain self registry, that the conduction field plate be patterned by the same etching sequence that defines the diffusion mask for the base region diffusion step.

A donor activator impurity, as for example, phosphorus, is next diffused into the portion of surface 12, beneath the apertured portion of field plate 24, of the silicon wafer 10. This is done by conventional means, as described in detail in our copending application Ser. No. 679,957. For example, a phosphorous doped film may be deposited over the patterned wafer by pyrolysis of ethyl orthosilicate and triethyl phosphate in a 10:1 volumetric ratio with the substrate heated for 6 minutes at 800° C. to form a 2000 AU film of phosphorus doped silicon dioxide. The wafer is then heated to diffuse phosphorus into collector region 11. Diffusion of the coated wafer for a period of approximately 16 hours at 1100° C then results in the formation of a phosphorus doped base region 13 approximately 5 microns deep within wafer 10. After diffusion, the doped oxide film is etched away using a buffered HF etchant for a time sufficient to remove all doped oxide without substantially affecting the first deposited oxide layer, as for example, by etching in Buffered HF for approximately 1 minute.

Next, a 5000 AU thick film of oxide, for example, is formed over the entire wafer, as for example, by pyrolysis of ethyl orthosilicate, as described above, for 25 minutes at 800° C and the surface thereof is masked using photolithographic techniques to cover all but a restricted central portion which is etched away, as for example, by immersion in a "Buffered HF" etchant containing one part concentrated HF to approximately 10 parts of a 40 percent solution of NH4F for approximately 5 minutes to form a diffusion mask for the diffusion of emitter 15. After such etching, an acceptor activator impurity, as for example, boron is diffused into the exposed base region to form emitter region 15. Conveniently, the emitter may be diffused to a depth of approximately 3 microns with boron which may be accomplished conventionally, as for example, be depositing a 3000 AU thick boron doped layer of silicon dioxide by pyrolysis from a mixture of ethyl orthosilicate and triethyl borate in a 10:1 ratio by volume in 9 minutes. Next, the coated wafer is heated for 10 hours at a temperature of 1100° C, as is described in detail in our aforementioned application, Ser. No. 679,957, to form diffused emitter region 15 approximately 3 microns thick. Emitter, base, and collector regions may be formed as described above, or by equivalent means.

Contacts are made to the various regions, as is conventional, and as is described in greater detail in the aforementioned application of W. E. Engeler. Generally, a suitable mask is formed over the entire wafer using photolithographic techniques and discrete regions are allowed to remain exposed by the mask so as to form an aperture through the oxide coating down to the buried molybdenum field plate. Another aperture is etched to the emitter region, and a third aperture is etched down to a portion of the collector region. The wafer may then conveniently be covered with a 1000 AU thick film of aluminum by vacuum evacuation. The unrequired portions of the aluminum film are then etched away using photolithographic techniques to cover emitter, base, and field plate electrodes, leaving emitter electrode 18, base electrode 19, and field plate electrode 20. Contact is made to the collector by alloying wafer 10 to a header to form contact 21.

A suitable electrical circuit for a grounded emitter PNP surface diffused transistor, as illustrated in FIG. 1, is shown schematically with emitter 15 connected to ground. Collector 11 is connected through a load resistance 23 to $B^1$. Buried field plate 24 is connected to $B^1$ (a fixed negative potential of, for example, 20 volts). An input signal is applied between base electrode 19 and ground. The transistor output is taken across load resistance 23.

In operation, neither of the potentials applied to the exterior surface of insulating layer 17 by base electrode 19 or emitter electrode 18 can cause ion drift within insulator 17, and a resultant inversion at the surface-adjacent portion of collector 11, due to the presence of buried field plate 24. This is because field plate 24 is connected to a substantial negative potential, in this case, to $B^1$.

Buried field plate 24 prevents the migration of positive ions to the interface surface of the insulator by attracting positively charged ions thereto, thus effectively preventing inversion at the surface of the collector, due to this effect. Additionally, since the buried field plate 24 is connected to a substantial negative potential, majority carriers in collector region 11 are attracted to the depletion region, eliminating any surface channel. Since the negative potential is fixed, and does not follow the collector potential, it acts as an electrostatic shield which substantially eliminates feedback capacity between the collector and overlying base leads. This field plate further acts to prevent the formation of an induced collector "channel" under any overlying positive conductor.

In FIG. 2 of the drawing, an alternative structure to the device of FIG. 1 is illustrated in schematic vertical cross section. In FIG. 2, the section is deliberately made incomplete so as to indicate the adaptability of the structure for incorporation as a portion of a semiconductor chip upon which an integrated circuit may be fabricated. In FIG. 2, collector 31 has a surface diffused base 33 at one surface thereof defining therewith a collector junction 34. An emitter region 35 is surface diffused into base region 33 and defines therewith an emitter junction 36. An emitter electrode 38 is in contact with emitter region 35 and a base contact 30 is in electrical contact with base region 33. Buried field plates 43 and 44 comprise a pair of concentric annular "washers" the inner dimension of the innermost of which substantially matches the outer dimension of base region 33. Field plates 43 and 44 define a spacing 45 therebetween, which constitutes a diffusion mask through which a guard ring 32 is formed, simultaneously with the formation of emitter region 35, to further serve to limit the extension of the effective area of base 35 by surface inversion of collector 33. Although it is not necessary in the practice of the present invention that such a guard ring be formed, and it is quite sufficient, as illustrated in FIG. 1, that PNP junction transistors of this type omit such a guard ring, the embodiment of !FIG. 2 is illustrated to show that the utilization of a guard ring is quite compatible with the utilization of the buried field plate in accord with the present invention. The combination of the two gives excellent protection against collector surface channel formation and the deleterious effects thereof.

Figure 3:
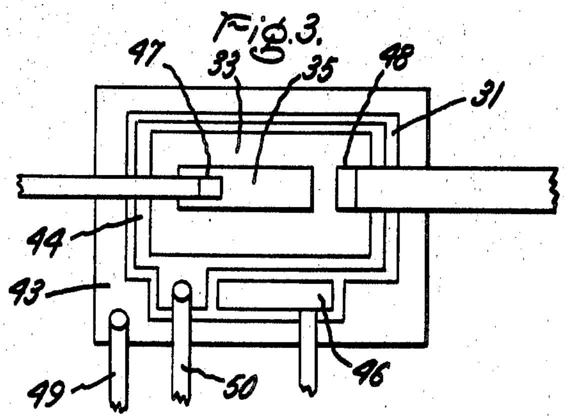
FIG. 3 is a semischematic plan view of the device of FIG. 2.

FIG. 3 of the drawing illustrates a schematic, vertical plan view of the device of FIG. 2. In FIG. 3, collector 31 is contacted by collector electrode 46, emitter 35 is contacted by emitter contact 47, and base 33 is contacted by base contact 48. Field plates 43 and 44 are connected to electrodes 49 and 50, respectively.

Although the invention has been described hereinbefore primarily with respect to surface-diffused PNP transistors, wherein the formation of an N-channel at the surface of a P-type collector region is to be avoided, the invention is also applicable to other surface-diffused transistor devices such, as for example, to NPN surface-diffused structures wherein it is desirable that the formation of an N-channel over the surface of a P-type base is to be avoided. In that case, the buried field plate is formed over the base region 13 where it intersects surface 12 in FIG. 1. In one embodiment of such a structure, the conducting film is deposited after the base region is surface diffused through a passivating oxide and is patterned at the same time that the emitter diffusion aperture is formed to form the field plate in registry with the emitter-base junction. In another embodiment of the invention, the field plate may be utilized in an NPN structure to prevent the formation of a P-channel over the surface of an N-type collector region. Such a structure is substantially as illustrated in FIGS. 1 and 2, except that a positive potential is applied to field plate 24 to prevent the formation of a P-channel in N-type collector 11.

In general, the buried field plate is effective to prevent surface channel formation at the intersection of any region, emitter, collector, or base of a junction transistor of any surface-diffused configuration with an insulating-passivating film. To accomplish this, the field plate is formed over, but insulated from, the region to be surface shielded in registry with the most important P–N junction by its simultaneous definition with the appropriate diffusion mask, and a charge is applied thereto that is opposite in polarity to the polarity of majority charge carriers in the region which is to be protected against surface-channel formation. One such structure is an NPN structure wherein a P-type base region is to be protected against N-channel formation.

Figure 4:
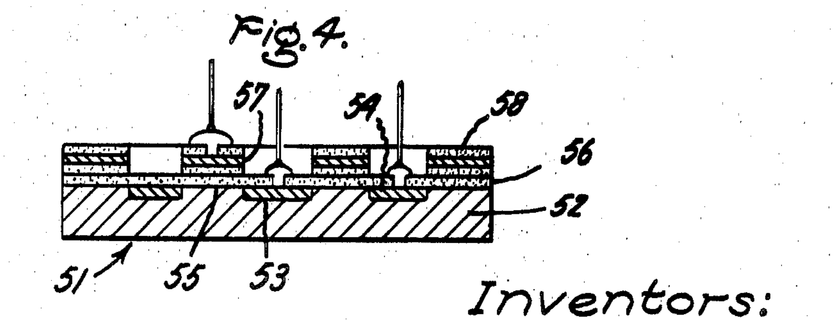
FIG. 4 is a schematic vertical cross-sectional view of yet another alternative embodiment of the invention.

One such other device is illustrated in FIG. 4 of the drawing. In FIG. 4, a lateral NPN transistor comprises a wafer 51, having a P-type base region 52 a central, diffused N-type emitter region 53 and an annular N-type surface-diffused region 54, diffused into the surface of the base region 52, concentric with emitter region 53. In the device of FIG. 4, surface leakage between the emitter and collector regions across a spurious N-channel formed at the interface 55 between insulating-passivating film 56 and base region 52 may deleteriously affect the operation of the device. In this respect, a buried annular field plate 57 within insulating layer 58, serves to attract positive ions thereto when appropriately negatively biased and prevents surface inversion of the base region due to this cause. In addition, as with the device of FIGS. 1—3, the substantial negative potential applied thereto serves to eliminate base channels, and serves as an electrostatic shield between the base region and any overlying conductors.

In further accord with another embodiment of the present invention, a structure similar to either that of FIGS. 1 or 2 of the drawing may have an added feature thereto. In accord with this feature, additional insurance against the formation of a surface-depletion region and a consequent N-channel along the interface between the collector and the insulating layer is provided by forming the metallic, for example molybdenum, buried field plate as a sufficiently thin film, so that, upon diffusion of acceptor-activator atoms, as for example boron, into the wafer to form the emitter region 15, with or without the formation of the guard ring 32, the length of the diffusion cycle and the thinness of the molybdenum film and the oxide is such that some penetration of the molybdenum by boron atoms occurs, and the surface-adjacent region of the collector beneath the entire buried molybdenum field plate is enhanced in P-type conductivity characteristics and has a lower resistance P-type conduction characteristic, thus eliminating any inherent tendency for the surface-adjacent region of the collector to form N-channels. The film thickness and diffusion cycle times given above are such as to accomplish this, typically, which the collector resistivity may be of the order of one ohm-cm and the resistivity of the guard ring may be of the order of 0.01 ohm–cm., the decreased P-type resistivity of the surface-adjacent region in accord with this modification might be of the order of 0.5 ohm–cm. Additionally, the final resistivity of the P-type enhanced region may be essentially the same as the bulk P-type resistivity. This is due to the fact that present-day technology of surface passivation, as described herein, generally results in the depletion of P-type charges from the interface-adjacent region and the creation of an N-type channel thereat. Diffusion of an acceptor into the interface-adjacent region of the P-type region, as described herein, is effective to restore the interface-adjacent portion of the P-type region to its original P-type characteristic.

From the foregoing, it will be apparent that we have provided improved configurations for surface-diffused junction transistors subject to creation of an opposite-type conductivity channel at the interface of a one-type conductivity channel at the interface of a one-type conductivity region and an insulating and passivating oxide. In one embodiment of the invention, a PNP transistor has the collector region protected from surface inversion, due to the drift of positive ions within a passivating dielectric, by the incorporation, within the dielectric layer, of a buried self-registered conducting field plate, preferably of a refractory metal such as molybdenum or tungsten, which effectively shields the collector and eliminates spurious channel conduction at the interface thereof. Additionally, we provide, in another embodiment of the invention, for a buried, apertured field plate, allowing for the diffusion of a heavily-doped P-type guard ring, concentric with the base region of the device at the same time the emitter region thereof is formed.

In still another PNP structure embodiment of the invention, we provide a buried field plate and insulator having a thickness such that, during diffusion of the emitter, some acceptor-activator atoms diffuse therethrough and provide an entire acceptor-enhanced P-type conductivity region at the surface of the collector region. In addition to the advantages sought to be gained by others in the art in similar devices, namely that of reducing surface leakage and, in the case of a PNP transistor of reducing collector capacitance, we provide added advantage, in that the buried field plate, in accord with our invention, is connected to a fixed potential, opposite to that of the majority charge carriers in the region sought to be shielded, as for example, in a PNP collector example, a negative potential which guards against feedback capacity in the device, and eliminates any inherent, previously-formed surface-adjacent channel.

While the invention has been set forth herein with respect to certain specific embodiments and illustrations thereof, many modifications and changes will readily occur to those skilled in the art. Accordingly, by the appended claims, we intend to cover all such modifications and changes as fall within the true spirit and scope of the present invention.

We claim:

1. A surface diffused semiconductor device exhibiting a high degree of stability against surface channel effects due to surface-adjacent majority carrier depletion at the interface thereof with an insulator and comprising:

a. a wafer of semiconductor material of substantially one electrical conductivity characteristic, said wafer including a major surface having major surface-adjacent regions of differing electrical conductivity characteristics and defining asymmetrically conductive junctions therebetween;

b. an insulator overlying at least one major surface-adjacent region having a one electrical conductivity characteristic c. an electrical conductor buried within said insulating layer and insulatingly superposed over said one conductivity region and in self-registration with at least one asymmetrically conductive junction d. means for applying a fixed electrical potential to said electrical conductor within said insulating layer; and e. said electrical potential being of opposite polarity to the majority conductive carriers in said one conductivity region.

2. The device of claim 1 wherein said electrical conductor is a metallic film.

3. The device of claim 2 wherein said one conductivity region is P-type and said metallic film is coincident with the boundary of said P-type region at its intersection with an N-type region at said major surface.

4. The device of claim 2 wherein said device is a junction transistor having a collector region, a base region surface-diffused into said collector region, and an emitter region surface-diffused into said base region and said buried metallic plate is superposed over said one conductivity type region and one edge thereof is coincident with the intersection of the junction between the collector and base region thereof with said major surface.

5. The device of claim 2 wherein said device is a PNP surface diffused transistor, said one conductivity type is a P-type regions, and said fixed electrical potential is negative.

6. The device of claim 5 wherein said P-type region is the collector and said buried metallic film has an edge coincident with but superposed over the base collector junction thereof.

7. The device of claim 6 wherein said buried film is laterally bifurcated and constitutes an inner portion and an outer portion surrounding said inner portion and defining therebetween a spacing which substantially defines the lateral extent of a major surface-adjacent portion of said P-type collector having greatly enhanced conductivity and constituting a guard ring.

8. The device of claim 6 wherein said metal film is permeable to acceptor activator atoms.

9. A method of forming a surface-diffused semiconductor device exhibiting a high degree of stability against surface channel effects due to surface-adjacent majority carrier depletion at the interface thereof with an insulator and including the steps of:

a. providing a semiconductor body having a major surface region of one electrical conductivity;
b. forming a first insulating film over said major surface region;
c. forming a film of a metallic conductor over said insulating film;
d. forming a second insulating film over said conducting film;

e. forming a pattern over said second insulating film and over said region of one electrical conductivity type;
f. removing a portion of said second insulating film and said conducting film to define a diffusion aperture;
g. diffusing an opposite conductivity inducing activator through said aperture and into said one conductivity surface region to form an asymmetrically conductive junction between said regions which junction intersects said major surface substantially under the edges of said aperture;
h. said aperture defining the extent of said opposite conductivity region automatically registering said conductive film over the remaining surface-adjacent portion of said one-conductivity region and in registry with said junction-surface intersection.

10. The method of claim 9 wherein said one conductivity region is a collector region of a transistor.